United States Patent
Lachheb

(10) Patent No.: US 9,875,422 B1
(45) Date of Patent: Jan. 23, 2018

(54) DATA COMPRESSION

(71) Applicant: Federal Express Corporation, Memphis, TN (US)

(72) Inventor: Tawfik Lachheb, Ladera Ranch, CA (US)

(73) Assignee: Federal Express Corporation, Memphis, TN (US)

(*) Notice: Subject to any disclaimer, the term of this patent is extended or adjusted under 35 U.S.C. 154(b) by 0 days.

(21) Appl. No.: 15/475,434

(22) Filed: Mar. 31, 2017

Related U.S. Application Data

(63) Continuation of application No. 15/265,228, filed on Sep. 14, 2016, now Pat. No. 9,647,685.

(51) Int. Cl.
*H03M 7/46* (2006.01)
*G06K 9/46* (2006.01)
*G06T 9/00* (2006.01)

(52) U.S. Cl.
CPC ............. *G06K 9/4642* (2013.01); *G06T 9/00* (2013.01); *H03M 7/46* (2013.01)

(58) Field of Classification Search
CPC .......... H03M 7/46; G06K 9/4642; G06T 9/00
USPC ...................................... 341/60–65
See application file for complete search history.

(56) References Cited

U.S. PATENT DOCUMENTS

| | | | | |
|---|---|---|---|---|
| 4,325,085 A | * | 4/1982 | Gooch | G06T 9/004 382/234 |
| 7,952,499 B1 | * | 5/2011 | Crivat | H03M 7/46 341/50 |
| 2003/0076288 A1 | | 4/2003 | Fish | |
| 2005/0269417 A1 | | 12/2005 | Wood | |
| 2011/0229033 A1 | | 9/2011 | Muquit | |
| 2015/0311916 A1 | | 10/2015 | Wirola et al. | |
| 2016/0321323 A1 | | 11/2016 | Gaumnitz et al. | |

OTHER PUBLICATIONS

Willcock et al, "Accelerating Sparse Matrix Computations via Data Compression," proceedings of the 20th annual international conference on Supercomputing, Jun. 2006, ACM New York, pp. 307-316.

Stackoverflow.com [online]. "Matrix compression methods," Aug. 2010 [retrieved Aug. 1, 2016]. Retrieved from the Internet: URL<http://stackoverflow.com/questions/3533044/matrix-compression-methods> 4 pages.

Gimbutas, "On the Compression of Low Rank Matrices," SIAM J. Scientific Computing, 2005, 26(4), pp. 1389-1404.

Paizão et al, Matrix compression methods, Feb. 23, 2015, retrieved from the Internet: URL https://peerj.com/preprints/849.pdf>, 33 pages.

* cited by examiner

Primary Examiner — Lam T Mai
(74) Attorney, Agent, or Firm — Fish & Richardson P.C.

(57) ABSTRACT

Methods, systems, and apparatus, including computer programs encoded on a computer storage medium, for compressing rows of data stored in a first matrix using run length encoding (RLE) to produce an RLE encoded matrix. Compressing columns of the RLE encoded matrix into a set of arrays by differentially encoding data count values of the RLE encoded matrix, wherein each array in the set of arrays represents a column of the RLE encoded matrix.

20 Claims, 3 Drawing Sheets

Average Map Submission Times (Sec)

| Station | Legacy | Compressed Matrix | Difference | Percent Improvement |
|---|---|---|---|---|
| 152 | 195.65 | 40.38 | (155.27) | 79.36% |
| 156 | 199.20 | 26.33 | (172.87) | 86.78% |
| 171 | 66.49 | 21.79 | (44.70) | 67.23% |
| 333 | 286.67 | 42.35 | (244.32) | 85.23% |
| 441 | 620.00 | 14.00 | (606.00) | 97.74% |
| 513 | 60.00 | 7.88 | (52.13) | 86.88% |
| 537 | 183.16 | 25.26 | (157.89) | 86.21% |
| 563 | 93.49 | 16.93 | (76.56) | 81.89% |
| 564 | 63.33 | 11.11 | (52.22) | 82.46% |
| 577 | 68.57 | 13.15 | (55.42) | 80.82% |
| 582 | 103.33 | 10.11 | (93.23) | 90.22% |
| 590 | 81.82 | 9.58 | (72.23) | 88.29% |
| 592 | 4.62 | 3.24 | (1.38) | 29.90% |
| 752 | 502.50 | 15.94 | (486.56) | 96.83% |
| All Betas | 188.00 | 22.89 | (165.11) | 87.82% |

FIG. 3

DATA COMPRESSION

CROSS REFERENCE TO RELATED APPLICATIONS

This application is a continuation application of U.S. patent application Ser. No. 15/265,228, filed on Sep. 14, 2016, which is hereby incorporated by reference in its entirety.

BACKGROUND

High-resolution representations of spatial data such as geographic maps and map overlays can be used to quickly visualize large amounts of data. Processing spatial data representations can become computationally inefficient and storing or transferring such data can require significant memory and bandwidth resources.

SUMMARY

This specification relates to techniques for efficiently processing data represented in matrix form. More specifically, implementations of the present specification relate to techniques for processing data matrices that contain repetitive data such as representations of spatial polygonal data. Implementations take advantage of repetitive data to compress both rows and columns of a matrix into a highly compact set of arrays.

In general, innovative aspects of the subject matter described in this specification can be embodied in methods that include the actions of compressing rows of data stored in a first matrix using run length encoding (RLE) to produce an RLE encoded matrix. Compressing columns of the RLE encoded matrix into a set of arrays by differentially encoding data count values of the RLE encoded matrix, wherein each array in the set of arrays represents a column of the RLE encoded matrix. Other implementations of this aspect include corresponding systems, apparatus, and computer programs, configured to perform the actions of the methods, encoded on computer storage devices.

In another general aspect, innovative aspects of the subject matter described in this specification can be embodied in methods that include actions of compressing, rows of data stored in a first matrix using run length encoding (RLE) to produce an RLE encoded matrix, wherein each cell of the RLE encoded matrix includes an RLE cell value comprising a data value from the first matrix and an associated count value that represents consecutive instances of a respective data value in a corresponding row of the first matrix. Compressing columns of the RLE encoded matrix into a set of arrays by representing each column of the RLE encoded matrix as an array. The array includes, for each different data value in a column of the RLE encoded matrix: the data value from the column, and a set of respective difference values that represent a differential change in count values associated with the data value in consecutive cells of the column. Other implementations of this aspect include corresponding systems, apparatus, and computer programs, configured to perform the actions of the methods, encoded on computer storage devices.

These and other implementations can each optionally include one or more of the following features.

Some implementations can include determining a minimum number of bits required to represent data values and differentially encoded data count values in the arrays, and storing each of the data values and the differentially encoding data count values using the determined minimum number of bits.

Some implementations can include compressing the set of arrays using ZIP compression.

In some implementations, the first matrix is a spatial map of a geographic area and the data stored in the first matrix represents regions within the spatial map.

In some implementations, a compression ratio between the set of arrays and the first matrix is at least 500:1. In some implementations, a compression ratio between the set of arrays and the first matrix is at least 900:1. In some implementations, a compression ratio between the set of arrays and the first matrix is at least 1000:1.

Particular implementations of the subject matter described in this specification can be implemented so as to realize one or more of the following advantages. Implementations may improve the efficiency with which computing devices process spatial data, for example, geographic maps, map overlays, and images. Implementations may reduce the amount of computer memory required for storing large data matrices. Implementations may reduce the network bandwidth required for transmitting large data matrices between computing devices. Implementations may improve the efficiency with which computing devices render graphics related to large data matrices. Implementations may improve the efficiency of performing mathematical operations on large data matrices. Implementations may improve the efficiency with which matrix data is saved and loaded by computing devices.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIG. 3 is a table of experimental results showing improvements in the efficiency of processing data matrices that are compressed in accordance with implementations of the present disclosure.

DETAILED DESCRIPTION

Implementations of the present disclosure generally relate to techniques for efficiently processing data represented in matrix form. More specifically, implementations of the present specification relate to techniques for processing data matrices that contain repetitive data. Implementations take advantage of repetitive data to compress both rows and columns of a matrix into a highly compact set of arrays. For example, matrix data can be compressed along the rows of the matrix using a first compression technique to produce a compressed matrix. The data in the compressed matrix can then be compressed along the columns of the compressed matrix using a second compression technique.

In some examples, the matrix data can first be compressed using run length encoding (RLE). Then the compressed matrix (RLE encoded data) can be compressed using differential encoding.

In some implementations, the matrix data can be compressed, first, along columns of the matrix using the first compression technique, and the data in the compressed matrix can then be compressed along rows of the compressed matrix using the second compression technique.

Implementations of the present disclosure will be discussed in further detail with reference to an example context. The example context includes a geographical information system (GIS) for logistics planning. A GIS is a computing system that uses spatial data to optimize package sorting and truck loading for efficient package delivery. It is appreciated, however, that implementations of the present disclosure can be realized in other appropriate contexts, for example, geographic mapping, route planning, real estate analysis, urban planning, natural resource mapping and research (e.g., watershed mapping and evaluation, oil and mineral research and evaluation), and scientific research (e.g., mapping and evaluating animal migration patterns).

Figure 1A:
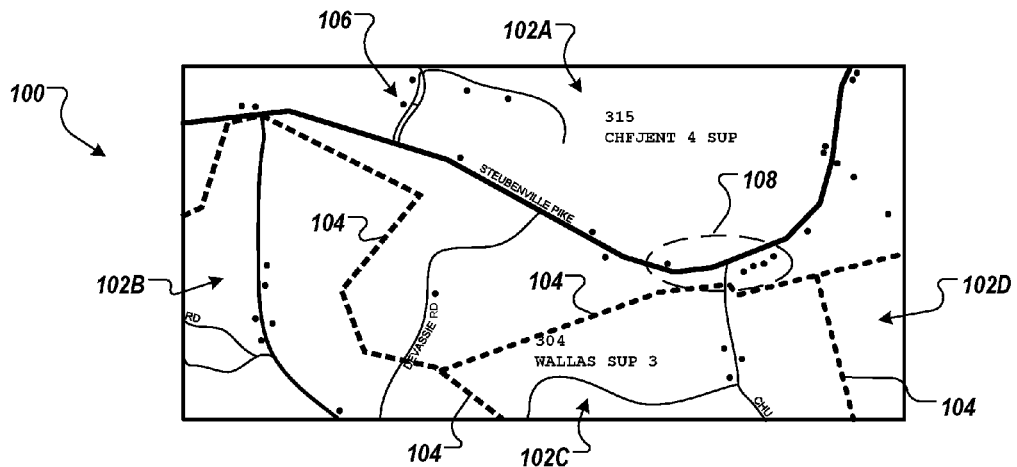
FIG. 1A shows an example of spatial data that can be represented by a data matrix.

Turning to the figures, FIG. 1A shows an example of spatial data, a map 100, that can be represented by a data matrix. The map 100 includes four geographic regions 102A-102D that represent package delivery areas for a logistics company. The regions 102A-102D are non-overlapping polygons defined by dashed lines 104. For example, a different delivery driver may be assigned to each of the regions 102A-102D.

Furthermore, each of the dots 106 represent a package delivery location. For example, a GIS can identify delivery locations for the packaging and the region in which each delivery location lies in order to properly sort and load incoming packages on the correct delivery vehicles. The GIS can use the map 100 to, for example, determine the volume of packages to be delivered in each region and ensure that the delivery vehicle(s) assigned to each region have sufficient capacity to deliver all of the packages.

More specifically, the GIS can process delivery data (e.g., location addresses) for each of the incoming packages during a delivery period (e.g., each day) to determine the package volume that needs to be distributed within each of the regions 102A-102D. On occasion it may be advantageous to re-map the regions 102A-102D or add additional package delivery regions to, for example, accommodate the capacity of delivery vehicles. For example, region 102A includes twenty-two package delivery locations while region 102C includes only three package delivery locations. Furthermore, several of the package delivery locations (locations 108) are near the border between region 102A and 102C. Therefore, the GIS may optimize the package delivery logistics by shifting the border between region 102A and 102C upwards such that locations 108 are shifted to region 102C.

Figure 1B:
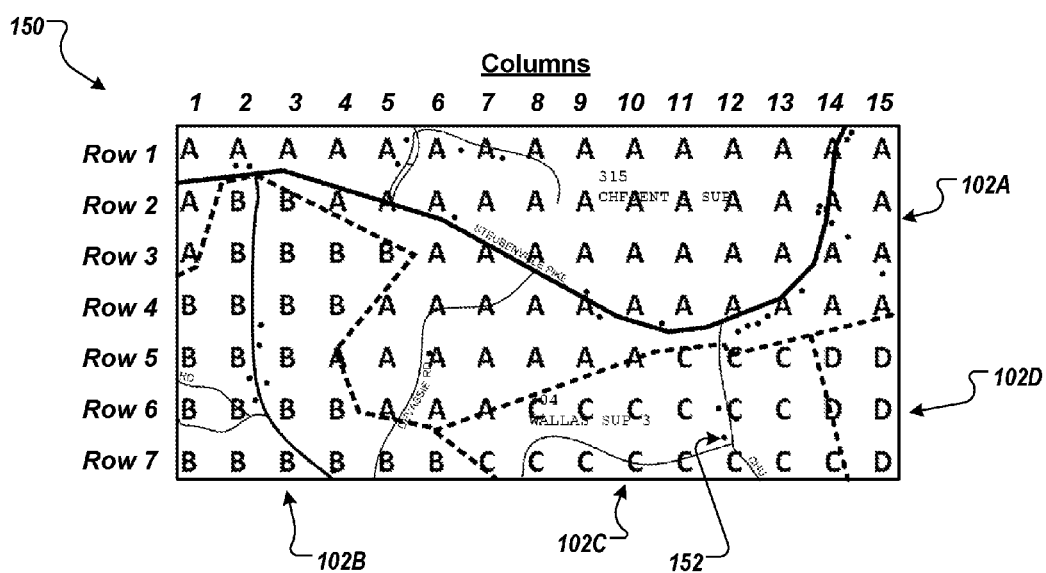
FIG. 1B shows an example data matrix overlaid on the spatial data of FIG. 1A.

The GIS can perform the above-described processes by representing the spatial regions 102A-102D as a matrix and identifying delivery location points using a point-in polygon analysis. FIG. 1B shows an example data matrix 150 overlaid on the map 100 of FIG. 1A. The locations on the map 100 are represented by the cells of the matrix 150 and the non-overlapping polygons (regions 102A-102D) are represented by the data values (e.g., cell or pixel values) of the matrix 150. More specifically, map coordinates (e.g., longitude and latitude or grid coordinates) can be mapped to corresponding indices (e.g., rows and columns) of the matrix 150. The data values of the matrix (e.g., A, B, C, D) represent the identity of the regions (102A-102D) in which particular locations lie. For example, the latitude and longitude of location 152 may correspond to Row 7, Column 12 of the matrix 150. The data value of the matrix 150 at [7, 12] is "C" indicating that location 152 lies in Region 102C.

Using this method, the GIS can quickly identify the geographic regions 102A-102D in which large numbers of geographic locations lie. For example, delivery addresses for thousands of packages can quickly be categorized into delivery regions to facilitate accurate and efficient package sorting and loading. Moreover, regions can be revised and locations re-categorized by changing the data values of matrix 150 cells. For example, if, as discussed above, a logistics operation manager wanted to alter the boundary between regions 102A and 102C in order to move locations 108 of FIG. 1A into region 102C, the GIS system could perform such an alteration by changing the values of cells [4, 10], [4, 11], [4, 12], and [4, 13] from "A" to "C."

Furthermore, additional spatial matrix operations can be performed using spatial data matrices including, but not limited to, identifying unions between areas of two matrices, identifying intersections between two matrices, computing difference regions between two matrices, computing a symmetric difference between two matrices, generating point density maps (e.g., heat maps and radius evaluations), and performing topology validity (e.g., coverage evaluation and overlap detection). For example, non-existence of overlapping polygons may be a requirement in the context of implementations of the present disclosure. Uncovered areas can be identified by computing the difference between a matrix that represents the area to be covered and a matrix representing a given polygon fabric.

Spatial data matrices that cover large areas or provide high resolution data can become excessively large. For example, a spatial data matrix representing a raw logistics map overlay for a 100,000 meter by 100,000 meter area can be 10 GB of data. These large data sizes can result in significant increases in processing time and bandwidth constraints on a GIS when performing operations on the matrices, storing the matrices, loading the matrices, and transmitting the matrices between computing devices (e.g., computers, servers, notebooks, tablets, etc.). Therefore, the matrices are compressed to reduce the memory required to store the matrices and to improve the efficiency with which computing devices can process the matrices. In some implementations, the matrices are compressed in a manner that allows at least some of the spatial matrix operations discussed above to be performed without the need to decompress the matrices into a raw (uncompressed) format.

Figure 2:
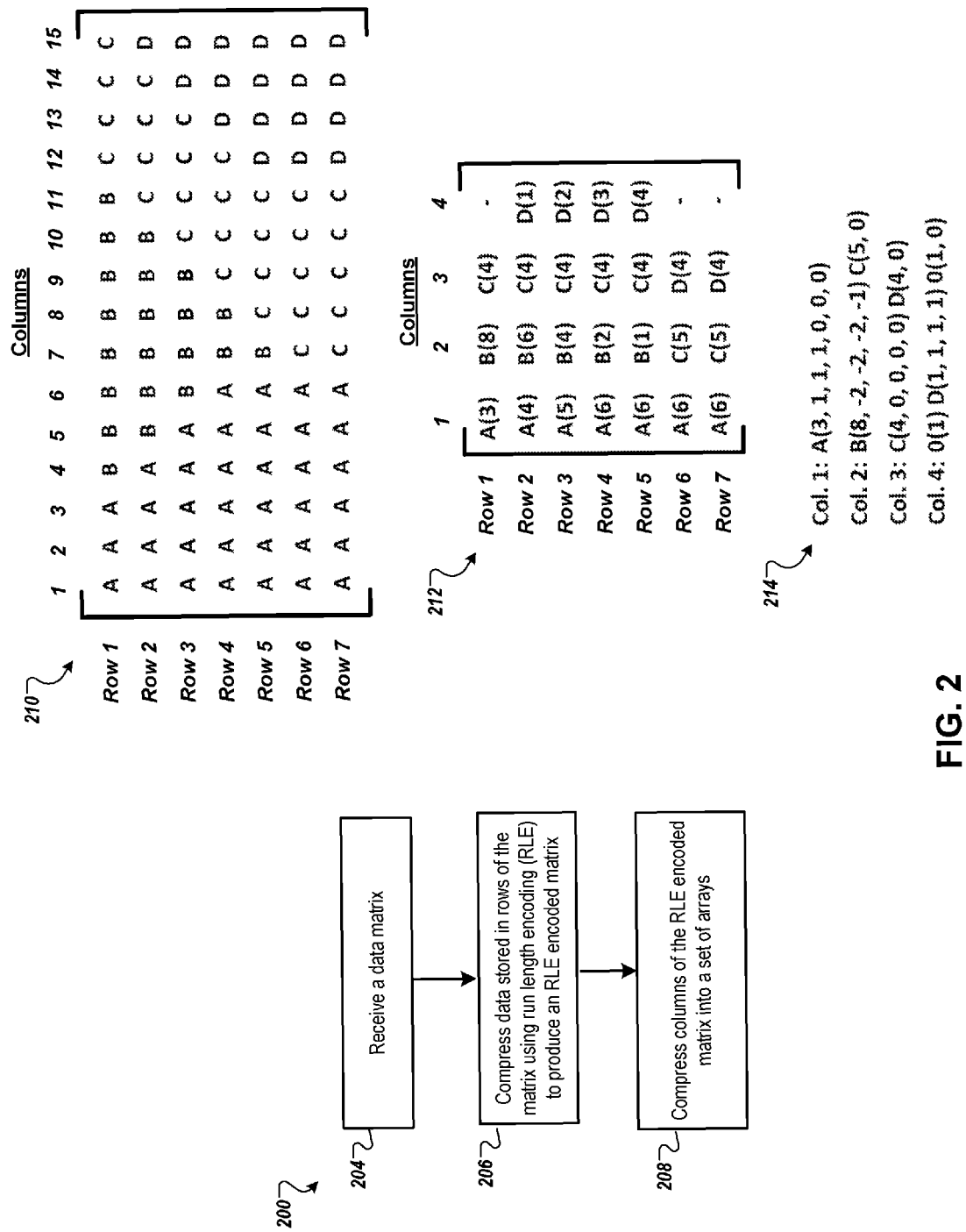
FIG. 2 is a flow chart of an example process for compressing a data matrix.

FIG. 2 shows a flow chart of an example process 200 for compressing a data matrix 210 that can be executed in accordance with implementations of the present disclosure. In some implementations, the example process 200 can be realized using one or more computer-executable programs that are executed using one or more computing devices (e.g., a GIS). In some implementations, the example process 200 can be used for compressing matrices of spatial data such as logistic operation maps.

A raw data matrix 210 is received (204). For example, the data matrix 210 can include data that is highly repetitive. The data matrix 210 is a "raw" (e.g., uncompressed) matrix of data values. The data matrix 210 can, for example, include data representing spatial regions such as geographic map overlays including, but not limited to, logistic planning data (e.g., logistic operation regions), natural resource data, urban planning data (e.g., population data, zoning data), and real estate analysis data (e.g., school districts, neighborhoods). In some examples, the received data matrix 210 can include 10 GB or more of data.

Data in the rows of the data matrix 210 is compressed using a first compression method to produce a compressed matrix. For example, data stored in the rows of the data matrix 210 is compressed using RLE to produce an RLE encoded matrix 212 (206). For example, the data values in Row 1 of data matrix 210 can be represented by the data value and the number of consecutive times that the data value occurs in the row (e.g., the data count or run length). For example, in Row 1 of data matrix 210 the value "A" (e.g., logistic region A) occurs 3 times, followed by the value "B" 8 times, and the value "C" 4 times. Therefore, Row 1 of data matrix 210 is encoded as shown in Row 1 of the RLE encoded matrix 212 (i.e., A(3) B(8) C(4)), where the number in parenthesis represents the data count value (or run length) for each individual data value in Row 1 of data matrix 210. Rows 1, 6, and 7 of Column 4 in the RLE encoded matrix 212 is null because, for example, the corresponding Rows 1, 6, and 7 of the data matrix 210 include fewer different data values than other rows (e.g., Rows 2-5) of the data matrix 210.

Data in the columns of the compressed data matrix are compressed using a second compression method to produce a set of arrays. For example, data in the columns of the RLE encoded matrix 212 is compressed into a set of arrays 214 (208). The data in each column of the RLE encoded matrix 212 is compressed by differentially encoding the data count values of each subsequent row in the column. For example, the array for Column 1 of the RLE encoded matrix 212 includes the first data value "A" followed by a series of numbers representing the count values associated with the data value "A" in each row of Column 1 from the RLE encoded matrix.

Specifically, the first number after the data value "A" (e.g., 3) represents the actual count value associated with "A" in Row 1, Column 1 of the RLE encoded matrix 212. Then each subsequent number represents the differential change in count values between consecutive subsequent and prior cells of the RLE encoded matrix 212 column being compressed. That is, each differentially encoded value for a column array can be represented by C[i]=RLE [i]–RLE [i–1], where C[i] represents the i-th differentially encoded count value of an array and RLE[i–1] and RLE[i] represent the count value of the (i–1)-th and i-th rows of the RLE encoded matrix 212.

For example, the Rows 1-7 of the Column 1 of the RLE encoded matrix 212 are as follows: A(3), A(4), A(5), A(6), A(6), A(6), and A(6). Therefore, compressing this data into the differentially encoded array for Column 1 yields "A" (the data value) followed by "3" (the first count value associated with "A"), then the series "1, 1, 1, 0, 0, 0," representing the difference between each subsequent count value associated with the data value "A."

As another example, the Rows 1-7 of the Column 2 of the RLE encoded matrix 212 are as follows: B(8), B(6), B(4), B(2), B(1), C(5), and C(5). Therefore, compressing this data into the differentially encoded array for Column 2 yields "B" (the first data value) followed by "8" (the first count value associated with "B"), then the series "8, –2, –2, –2, –1," representing the difference between each subsequent count value associated with the data value "A," then "C" (the second data value included in Column 2) followed by "5" (the first count value associated with "C"), then "0" representing the difference between the count value associated with "C" between Rows 7 and 8 of Column 2.

The compressed array representing Column 4 of the RLE encoded matrix 212 includes placeholders (0(1)) and (0(1, 0)) to indicate that some of the rows (e.g., Rows 1, 6, and 7) from Column 4 of the RLE encoded matrix are null. That is, those rows did not include any RLE data because, for example, the corresponding rows of the raw data matrix 210 included fewer different data values than other rows of the raw data matrix 210.

In some implementations, a minimum number of bits required to represent data in the set of arrays 214 can be determined and the arrays 214 can be further compressed by reducing the number of bits required to store the data contained therein. For example, a minimum number of bits or bytes required to store the data values, the difference values, or both included in the set of arrays 214 can be determined. Differentially encoding the RLE data count values will generally result in the differentially encoded data having a smaller magnitude than the original RLE count values.

For example, referring to Column 1 of the RLE encoded matrix 212 the data count values are 3, 4, 5, and 6, each of which requires two or more bits to be represented as binary data. The value 3 requires two bits (e.g., 3=11b), and the values 4, 5, and 6 each require 3 bits (e.g., 4=100b, 5=101b, and 6=110b). However, when differentially encoded in the Col. 1 array, the differentially encoded data can be represented by only 1 bit. For example, the differentially encoded values in the Col. 1 array are only 1's and 0's, which can be represented by only 1 bit each. Thus, these differentially encoded values can each be further compressed by using only 1 bit each to store them.

In some implementations, a matrix can be compressed, first, along columns of the matrix using the first compression technique (e.g., RLE), and the data in the compressed matrix can then be compressed along rows of the compressed matrix using the second compression technique (e.g., differential encoding).

In some implementations, a matrix that has been compressed to a set of arrays is uncompressed to the raw matrix state to perform spatial matrix operations such as those discussed above. In some implementations, matrix point look ups can be performed on a compressed matrix by uncompressing the matrix only to the RLE encoded matrix state. For a given set of N different data values, the average number of columns in the RLE is $$\sqrt{N}.$$

Point lookups using the RLE can be done in constant time proportional to $$\frac{\sqrt{N}}{2}$$

regardless of the number of rows in the RLE.

In some implementations, the set of arrays 214 can be further compressed using a third compression method. For example, the arrays 214 can be compressed using a lossless compression method such as ZIP compression to take advantage of the high repetitiveness in the set of arrays 214.

In examples implementations, the above described techniques can yield a compression ratio between the set of arrays and the first matrix of at least 500:1. In examples implementations, the above described techniques can yield a compression ratio between the set of arrays and the first matrix of at least 900:1. In examples implementations, the above described techniques can yield a compression ratio between the set of arrays and the first matrix of at least 1000:1. For example, in beta testing the above techniques have reduced matrix ranging between 1 GB and 3 GB in size to between 500 kB and 3 MB in size.

FIG. 3 is a table 300 of experimental results showing improvements in the efficiency of processing data matrices that are compressed in accordance with implementations of the present disclosure. The table 300 lists the results from beta testing of a GIS submission process for logistic maps compressed according to implementations disclosed herein. Specifically, the table 300 compares submission times (in seconds) of the GIS system for logistic maps that are not compressed (Legacy) to submission times for logistic maps that are compressed according to implementations of the present specification (Compressed Matrix). For example, GIS station 752 experienced a reduction in map submission time of 486.56 seconds from 502.5 seconds to 15.94 seconds representing an overall improvement in processing efficiency of 96.83%.

Implementations of the subject matter and the functional operations described in this specification can be implemented in digital electronic circuitry, in tangibly-implemented computer software or firmware, in computer hardware, including the structures disclosed in this specification and their structural equivalents, or in combinations of one or more of them. Implementations of the subject matter described in this specification can be implemented as one or more computer programs, i.e., one or more modules of computer program instructions encoded on a tangible non transitory program carrier for execution by, or to control the operation of, data processing apparatus. The computer storage medium can be a machine-readable storage device, a machine-readable storage substrate, a random or serial access memory device, or a combination of one or more of them.

The term "data processing apparatus" refers to data processing hardware and encompasses all kinds of apparatus, devices, and machines for processing data, including, by way of example, a programmable processor, a computer, or multiple processors or computers. The apparatus can also be or further include special purpose logic circuitry, e.g., a central processing unit (CPU), a FPGA (field programmable gate array), or an ASIC (application specific integrated circuit). In some implementations, the data processing apparatus and/or special purpose logic circuitry may be hardware-based and/or software-based. The apparatus can optionally include code that creates an execution environment for computer programs, e.g., code that constitutes processor firmware, a protocol stack, a database management system, an operating system, or a combination of one or more of them. The present disclosure contemplates the use of data processing apparatuses with or without conventional operating systems, for example Linux, UNIX, Windows, Mac OS, Android, iOS or any other suitable conventional operating system A computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a communication network. While portions of the programs illustrated in the various figures are shown as individual modules that implement the various features and functionality through various objects, methods, or other processes, the programs may instead include a number of submodules, third party services, components, libraries, and such, as appropriate. Conversely, the features and functionality of various components can be combined into single components as appropriate The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., a central processing unit (CPU), a FPGA (field programmable gate array), or an ASIC (application specific integrated circuit Computers suitable for the execution of a computer program include, by way of example, can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few Computer readable media (transitory or non-transitory, as appropriate) suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The memory may store various objects or data, including caches, classes, frameworks, applications, backup data, jobs, web pages, web page templates, database tables, repositories storing business and/or dynamic information, and any other appropriate information including any parameters, variables, algorithms, instructions, rules, constraints, or references thereto. Additionally, the memory may include any other appropriate data, such as logs, policies, security or access data, reporting files, as well as others. The processor and the memory can be supplemented by, or incorporated in, special purpose logic circuitry To provide for interaction with a user, implementations of the subject matter described in this specification can be implemented on a computer having a display device, e.g., a CRT (cathode ray tube), LCD (liquid crystal display), or plasma monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Implementations of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network (LAN), a wide area network (WAN), e.g., the Internet, and a wireless local area network (WLAN).

The computing system can include clients and servers. A client and server are generally remote from each other and typically interact through a communication network. The relationship of client and server arises by virtue of computer programs running on the respective computers and having a client-server relationship to each other While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a sub combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be helpful. Moreover, the separation of various system modules and components in the implementations described above should not be understood as requiring such separation in all implementations, and it should be understood that the described program components and systems can generally be integrated together in a single software product or packaged into multiple software products.

While this document contains many specific implementation details, these should not be construed as limitations on the scope of what may be claimed, but rather as descriptions of features that may be specific to particular implementations or embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

The invention claimed is:

1. A system comprising:
   at least one processor; and a data store coupled to the at least one processor having instructions stored thereon which, when executed by the at least one processor, causes the at least one processor to perform operations comprising:
   obtaining a first matrix that represents a spatial overlay for a map, the spatial overlay being divided into a plurality of regions which are represented by data values of the first matrix; and
   compressing the spatial overlay by:
   compressing rows of data values in the first matrix using run length encoding (RLE) to produce an RLE encoded matrix, and
   compressing columns of the RLE encoded matrix into a set of arrays by differentially encoding data count values of the RLE encoded matrix, wherein each array in the set of arrays represents a column of the RLE encoded matrix.

2. The system of claim 1, wherein the operations further comprise modifying one or more of the plurality of regions in the spatial overlay by changing respective values of the first matrix.

3. The system of claim 1, wherein the operations further comprise identifying a region from the plurality of regions in which a geographic location on the map lies.

4. The system of claim 3, wherein identifying the region in which the geographic location on the map lies comprises:
   uncompressing the set of arrays to produce the RLE encoded matrix; and
   identifying a data value of the first matrix that corresponds with coordinates of the geographic location.

5. The system of claim 1, wherein the operations further comprise determining a number of locations on the map that lie within a region of the plurality of regions.

6. The system of claim 5, wherein the operations further comprise, in response to determining the number of locations on the map that lie within the region, modifying the region by changing respective values of the first matrix.

7. The system of claim 5, wherein determining the number of locations on the map that lie within the region comprises:
   uncompressing the set of arrays to produce the RLE encoded matrix; and
   performing matrix point look ups on the RLE encoded matrix to identify the number of locations on the map that lie within the region.

8. The system of claim 1, wherein the operations further comprise:
   determining a minimum number of bits required to represent data values and differentially encoded data count values in the arrays; and storing each of the data values and the differentially encoding data count values using the determined minimum number of bits.

9. The system of claim 1, wherein the operations further comprise compressing the set of arrays using ZIP compression.

10. The system of claim 1, wherein the operations further comprise uncompressing the spatial overlay by:
uncompressing the set of arrays to produce the RLE encoded matrix; and
uncompressing the RLE encoded matrix to provide the uncompressed first matrix.

11. A computer-implemented method executed by one or more processors, the method comprising:
obtaining, by the one or more processors, a first matrix that represents a spatial overlay for a map, the spatial overlay being divided into a plurality of regions which are represented by data values of the first matrix; and
compressing, by the one or more processors, the spatial overlay by:
compressing rows of data values in the first matrix using run length encoding (RLE) to produce an RLE encoded matrix, and
compressing columns of the RLE encoded matrix into a set of arrays by differentially encoding data count values of the RLE encoded matrix, wherein each array in the set of arrays represents a column of the RLE encoded matrix.

12. The method of claim 11, further comprising modifying one or more of the plurality of regions in the spatial overlay by changing respective values of the first matrix.

13. The method of claim 11, further comprising identifying a region from the plurality of regions in which a geographic location on the map lies.

14. The method of claim 13, wherein identifying the region in which the geographic location on the map lies comprises:
uncompres sing the set of arrays to produce the RLE encoded matrix; and
identifying a data value of the first matrix that corresponds with coordinates of the geographic location.

15. The method of claim 11, further comprising determining a number of locations on the map that lie within a region of the plurality of regions.

16. The method of claim 15, further comprising, in response to determining the number of locations on the map that lie within the region, modifying the region by changing respective values of the first matrix.

17. The method of claim 15, wherein determining the number of locations on the map that lie within the region comprises:
uncompres sing the set of arrays to produce the RLE encoded matrix; and
performing matrix point look ups on the RLE encoded matrix to identify the number of locations on the map that lie within the region.

18. The method of claim 11, further comprising:
determining a minimum number of bits required to represent data values and differentially encoded data count values in the arrays; and
storing each of the data values and the differentially encoding data count values using the determined minimum number of bits.

19. The method of claim 11, further comprising uncompressing the spatial overlay by:
uncompres sing the set of arrays to produce the RLE encoded matrix; and
uncompressing the RLE encoded matrix to provide the uncompressed first matrix.

20. A non-transitory computer readable storage device storing instructions that, when executed by at least one processor, cause the at least one processor to perform operations comprising:
obtaining a first matrix that represents a spatial overlay for a map, the spatial overlay being divided into a plurality of regions which are represented by data values of the first matrix; and
compressing the spatial overlay by:
compressing rows of data values in the first matrix using run length encoding (RLE) to produce an RLE encoded matrix, and
compressing columns of the RLE encoded matrix into a set of arrays by differentially encoding data count values of the RLE encoded matrix, wherein each array in the set of arrays represents a column of the RLE encoded matrix.

* * * * *